United States Patent
Yan et al.

(10) Patent No.: US 10,782,353 B2
(45) Date of Patent: Sep. 22, 2020

(54) LITHIUM ION BATTERY RESIDUAL CAPACITY ESTIMATION DEVICE

(71) Applicant: MAZDA MOTOR CORPORATION, Hiroshima (JP)

(72) Inventors: Tenyu Yan, Hiroshima (JP); Takashi Utsunomiya, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 288 days.

(21) Appl. No.: 15/759,460

(22) PCT Filed: Dec. 5, 2016

(86) PCT No.: PCT/JP2016/086052
§ 371 (c)(1),
(2) Date: Mar. 12, 2018

(87) PCT Pub. No.: WO2017/110437
PCT Pub. Date: Jun. 29, 2017

(65) Prior Publication Data
US 2018/0259584 A1     Sep. 13, 2018

(30) Foreign Application Priority Data

Dec. 25, 2015  (JP) .................................. 2015-254575

(51) Int. Cl.
*G01R 31/3842*  (2019.01)
*H01M 10/48*    (2006.01)
(Continued)

(52) U.S. Cl.
CPC .......... *G01R 31/3842* (2019.01); *B60R 16/03* (2013.01); *H01M 4/02* (2013.01);
(Continued)

(58) Field of Classification Search
CPC .............. G01R 31/3842; H01M 10/48; H01M 10/0525; Y02E 60/122
See application file for complete search history.

(56) References Cited

U.S. PATENT DOCUMENTS 7,009,401 B2 *  3/2006  Kinoshita ............. H01M 10/48
                                            324/430
8,577,529 B2 * 11/2013  Takahashi ............. H02J 7/0021
                                            701/22
(Continued)

FOREIGN PATENT DOCUMENTS

CN     101276949 A     10/2008
CN     101592713 A     12/2009
(Continued)

OTHER PUBLICATIONS

International Search Report issued in PCT/JP2016/086052; dated Feb. 21, 2017.

(Continued)

*Primary Examiner* — Elias Desta
(74) *Attorney, Agent, or Firm* — Studebaker & Brackett PC

(57) ABSTRACT

A device that estimates the residual capacity of a lithium ion battery (3) that starts an engine starter (1), includes a control section (30) that calculates resistance values of a cathode and anode of the lithium ion battery based on detected values of a voltage sensor (SN1) and a current sensor (SN2) at the time when a first time has elapsed, and at the time when a second time longer than the first time has elapsed, from startup of the engine starter, and estimates the residual capacity from increases over time in the resistance values. The control section (30) starts the engine starter with the lithium ion battery under conditions under which the startup time of the engine starter will be longer when the last startup (Continued)

time of the engine starter is shorter than the second time or when a predetermined time period has elapsed from the last estimation.

7 Claims, 10 Drawing Sheets

(51) Int. Cl.
  *B60R 16/03* (2006.01)
  *H01M 4/02* (2006.01)
  *H01M 10/0525* (2010.01)

(52) U.S. Cl.
  CPC ....... *H01M 10/0525* (2013.01); *H01M 10/48* (2013.01); *H01M 10/486* (2013.01); *H01M 2004/027* (2013.01); *H01M 2004/028* (2013.01); *Y02E 60/122* (2013.01)

(56) References Cited

U.S. PATENT DOCUMENTS

| | | | |
|---|---|---|---|
| 8,822,054 B2* | 9/2014 | Joe | H02J 7/0063 |
| | | | 429/90 |
| 9,627,723 B2* | 4/2017 | Wang | H01M 10/625 |
| 2009/0086025 A1* | 4/2009 | Ngu | C01B 3/32 |
| | | | 348/159 |
| 2009/0295399 A1 | 12/2009 | Ueda et al. | |
| 2015/0127281 A1 | 5/2015 | Kusano et al. | |
| 2015/0301118 A1 | 10/2015 | Tao et al. | |
| 2017/0123013 A1 | 5/2017 | Tao et al. | |

FOREIGN PATENT DOCUMENTS

| | | |
|---|---|---|
| CN | 104813179 A | 7/2015 |
| CN | 105093129 A | 11/2015 |
| CN | 105738828 A | 7/2016 |
| JP | 2012-135168 A | 7/2012 |
| JP | 2013-101884 A | 5/2013 |
| JP | 2014-035283 A | 2/2014 |
| JP | 2014-044149 A | 3/2014 |
| JP | 2015-090342 A | 5/2015 |
| WO | 2012/073997 A1 | 6/2012 |

OTHER PUBLICATIONS

Chun Yin et al., Abstract of "Estimating the state of charge of lithium batteries based on fractional-order sliding-mode observer", ICFDA'14 International Conference on Fractional Differentiation and its Applications 2014, Jun. 23-25, 2014.

Pang Jingyue et al., "Indirect remaining useful life prognostics for lithium-ion battery", China Sciencepaper, Jan. 2014, vol. 9, No. 1, pp. 28-36.

* cited by examiner

LITHIUM ION BATTERY RESIDUAL CAPACITY ESTIMATION DEVICE

TECHNICAL FIELD

The technology disclosed herein relates to a lithium ion battery residual capacity estimation device.

BACKGROUND ART

In recent years, from the standpoint of improving the fuel efficiency of vehicles, vehicles adopting a so-called deceleration regenerative system, in which electric power is intensively generated during deceleration of vehicles thereby lightening the burden of engines, are increasing.

In a vehicle adopting the deceleration regenerative system, a lithium ion battery capable of quicker charging and discharging than a hitherto widely-used lead battery is often mounted, aside from the lead battery, for the purpose of charging a large capacity of electric power generated during deceleration in a short time. By mounting two types of electric storage devices different in properties, it is possible to secure a sufficiently large charging capacity while recovering electric power generated during deceleration without waste.

Patent Document 1 discloses a technology of measuring the voltage and current of a lithium ion battery at two timings during engine startup and estimating degradation of each of the cathode and anode of the lithium ion battery based on the measurement.

CITATION LIST

Patent Document

PATENT DOCUMENT 1: Japanese Unexamined Patent Publication No. 2014-44149

SUMMARY OF THE INVENTION

Technical Problem

Since the progress of degradation in the capacity of the lithium ion battery is not constant, it is necessary to estimate the degradation state on a short-term basis. Moreover, since the progress state of degradation over time is different between the cathode and anode of the lithium ion battery, it is necessary to estimate the capacity degradation for each of the cathode and the anode. For estimation of the capacity degradation of the cathode and anode of the lithium ion battery, it is necessary to detect the voltage and current of the lithium ion battery at two timings after the lithium ion battery has supplied electric power to the load. At this time, preferably, a current as large as possible flows from the lithium ion battery. In this respect, while it is preferable to detect the voltage and current of the lithium ion battery when an engine starter is started with the lithium ion battery, the detection of the voltage and current of the lithium ion battery may fail if the engine startup is too fast. In this case, there is a possibility that estimation of the residual capacity of the lithium ion battery may not be performed correctly.

In view of the above problem, an objective of the technology disclosed herein is improving the precision in the estimation of the residual capacity of a lithium ion battery mounted in a vehicle.

Solution to the Problem

The technology disclosed herein is directed to a lithium ion battery residual capacity estimation device that estimates a residual capacity of a lithium ion battery that starts an engine starter, including: a voltage sensor that detects a voltage of the lithium ion battery; a current sensor that detects a current of the lithium ion battery; and a control section that calculates resistance values of a cathode and anode of the lithium ion battery based on detected values of the voltage sensor and the current sensor at the time when a first time has elapsed, and detected values of the voltage sensor and the current sensor at the time when a second time that is longer than the first time has elapsed, from startup of the engine starter, and estimates the residual capacity of the lithium ion battery from increases over time in the resistance values of the cathode and the anode, wherein the control section starts the engine starter with the lithium ion battery under conditions under which the startup time of the engine starter will be longer when the last startup time of the engine starter is shorter than the second time or when a predetermined time period has elapsed from the last estimation of the residual capacity.

According to the structure described above, the startup time of the engine starter is extended when the past startup time of the engine starter is shorter than the second time or when a predetermined time period has elapsed from the last residual capacity estimation, whereby the voltage and current of the lithium ion battery at the time when the second time has elapsed from the startup of the engine starter are detectable. It is therefore possible to precisely estimate the residual capacity of the lithium ion battery.

The control section may start the engine starter with the lithium ion battery even when the detected value of the voltage sensor is lower than a criterion value for starting the engine starter, to increase the startup time of the engine starter.

The above lithium ion battery residual capacity estimation device may further include a temperature sensor that detects a water temperature of a radiator, wherein the control section may start the engine starter with the lithium ion battery even when a detected value of the temperature sensor is lower than a criterion value for starting the engine starter, to increase the startup time of the engine starter.

The control section may start the engine starter with the lithium ion battery during warm restart after an idling stop of the engine, and further starts the engine starter with the lithium ion battery even during cold startup, to increase the startup time of the engine starter.

The control section may start another starter different from the engine starter with the lithium ion battery by acting a power generation load on the another starter when the last startup time of the engine starter is shorter than the second time and a predetermined time period has elapsed from the last estimation of the residual capacity, and estimate the residual capacity of the lithium ion battery from the voltage value and current value of the lithium ion battery at this time.

The control section may drive auxiliaries with the lithium ion battery when failing to start the engine starter with the lithium ion battery, and estimate the residual capacity of the lithium ion battery from the voltage value and current value of the lithium ion battery at this time.

The control section may delay ignition timing of the engine to increase the startup time of the engine starter.

Advantages of the Invention

According to the technology disclosed herein, it is possible to improve the precision in the estimation of the residual capacity of a lithium ion battery mounted in a vehicle.

DESCRIPTION OF EMBODIMENTS

An exemplary embodiment will be described hereinafter in detail with reference to the drawings.

(1) Entire Configuration of Vehicle

Figure 1:
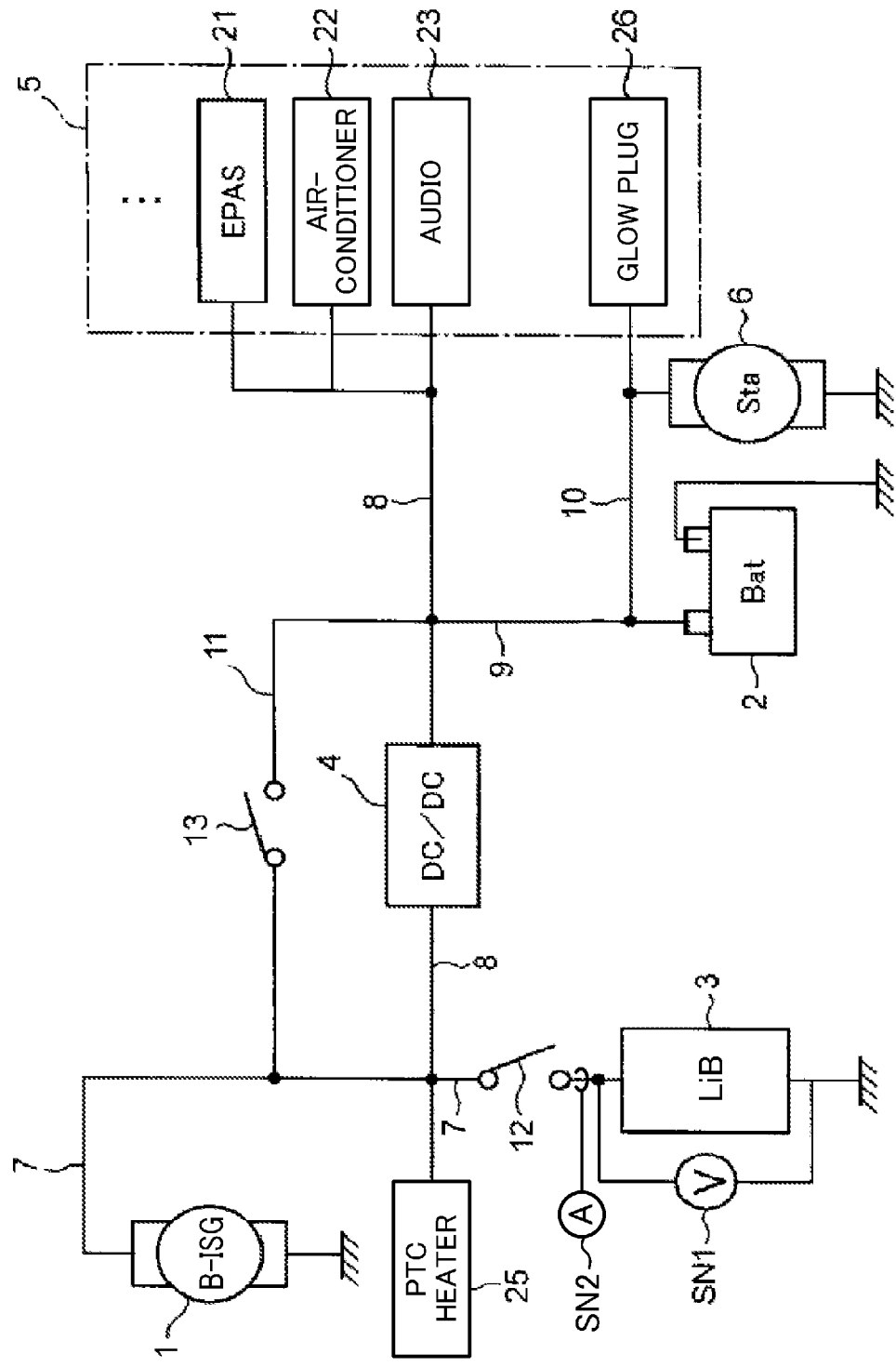
FIG. 1 is a circuit diagram showing the electrical configuration of a vehicle power control device.

FIG. 1 is a circuit diagram showing the electrical configuration of a vehicle power control device. The vehicle shown in FIG. 1 includes: a belt-driven integrated starter/generator (B-ISG) 1 that generates electric power by being powered from a gasoline engine (hereinafter, also simply called an engine) not shown provided in an engine room; a battery 2 and a lithium ion battery (LiB) 3 that store electric power generated by the B-ISG 1; a DC/DC converter 4 that steps down the electric power generated by the B-ISG 1; an electric load 5 constituted by various electric components that consume electric power; and a starter 6 that is driven during startup of the engine to crank the engine. Note that the B-ISG 1 corresponds to an "engine starter" as defined in the claims, the starter 6 corresponds to "another starter" as defined in the claims, and the electric load 5 corresponds to "auxiliaries" as defined in the claims.

The B-ISG 1, coupled with an output axis of the engine via a pulley belt (not shown), generates electric power by rotating, in a magnetic field, a rotor that rotates in an interlocking manner with the output axis of the engine. The generated electric power is adjustable within the range up to 25 V maximum depending on an increase/decrease of the current applied to a field coil that generates the magnetic field. Also, in the B-ISG 1, a rectifier (not shown) that converts the generated AC electric power into DC electric power is embedded. That is, the electric power generated by the B-ISG 1 is transmitted to various parts after being converted into DC by the rectifier. By contrast, the B-ISG 1 receives supply of electric power from the LiB 3, thereby operating as a starter to be able to start the engine.

The battery 2 is a lead battery having a nominal voltage of 12 V general as an electric storage device for vehicles. The battery 2 has the following characteristics: while it is unsuitable for quick charging and discharging because it stores electric energy by chemical reaction, it is capable of storing a comparatively large amount of electric power because it easily secure a charging capacity.

The LiB 3 is made of a plurality of lithium ion battery cells as the basic units coupled together to increase the capacity and is capable of charging up to 25 V maximum. The LiB 3 has the following characteristics: it is capable of comparatively quick charging and discharging and is small in internal resistance because, unlike the battery 2, it stores electricity by physical absorption of lithium ions.

The DC/DC converter 4 is of a switching type in which the voltage is changed by ON/OFF (switching operation) of an embedded switching element. Note that, in this embodiment, while the DC/DC converter 4 has a function of stepping down the voltage of the electric power supplied from the B-ISG 1 or LiB 3 side to the electric load 5 or battery 2 side (i.e., from the left to the right as viewed in FIG. 1) by switching operation, it doesn't have any other function than the above, such as a function of permitting supply of electric power in the direction opposite to the above (i.e., from the right to the left as viewed in FIG. 1) and a function of boosting the voltage.

The B-ISG 1 and the LiB 3 are connected to each other via a first line 7 for power supply. A second line 8 is branched from the first line 7, and the DC/DC converter 4 is placed midway on the second line 8. From the second line 8, a third line 9 is branched, via which the battery 2 and the second line 8 are connected to each other. From the third line 9, a fourth line 10 is branched, via which the starter 6 and the battery 2 are connected to each other.

A LiB cutoff relay 12 for interrupting the connection between the B-ISG 1 and the LiB 3 is placed at a position between the branching point of the second line 8 from the first line 7 and the LiB 3. The LiB cutoff relay 12 is made switchable between ON state (closed: connected state) permitting supply of electric power from the B-ISG 1 to the LiB 3 and OFF state (open: cutoff state) cutting off the supply of electric power.

Further, a bypass line 11 is branched from the first line 7 in parallel with the second line 8, and connected to a position of the second line 8 located on the output side with respect to the DC/DC converter 4. In other words, the bypass line 11 connects the B-ISG 1 and the electric load 5 without intervention of the DC/DC converter 4, and also connects the battery 2 and the LiB 3 without intervention of the DC/DC converter 4. A bypass relay 13 is provided on the bypass line 11 to interrupt these connections. The bypass relay 13 is made switchable between ON state (closed: connected state) permitting supply of electric power via the bypass line 11 (bypassing the DC/DC converter 4) and OFF state (open: cutoff state) cutting off the supply of electric power.

The electric load 5 includes an electric power assisted steering mechanism (hereinafter abbreviated as EPAS) 21 that assists driver's steering operation using driving force such as an electric motor, an air-conditioner 22, an audio 23, etc. The electric loads such as the EPAS 21, the air-conditioner 22, and the audio 23 are connected to the first line 7 via the second line 8 with the DC/DC converter 4 provided thereon or via the bypass line 11 without the DC/DC converter 4.

A glow plug 26 is also included in the electric load 5 according to this embodiment, in addition to the electric loads such as the EPAS 21. The glow plug 26 is a heater for warming a combustion chamber of the engine (gasoline engine in this embodiment) by electrical heating during cold startup of the engine. While the glow plug 26 is connected to the battery 2 in parallel with the starter 6, a PTC heater 25, which is a heater for warming the car interior by electrical heating and operates stably even at 25 V maximum, is placed on the B-ISG 1 and LiB 3 side with respect to the DC/DC converter 4.

(2) Control System

Figure 2:
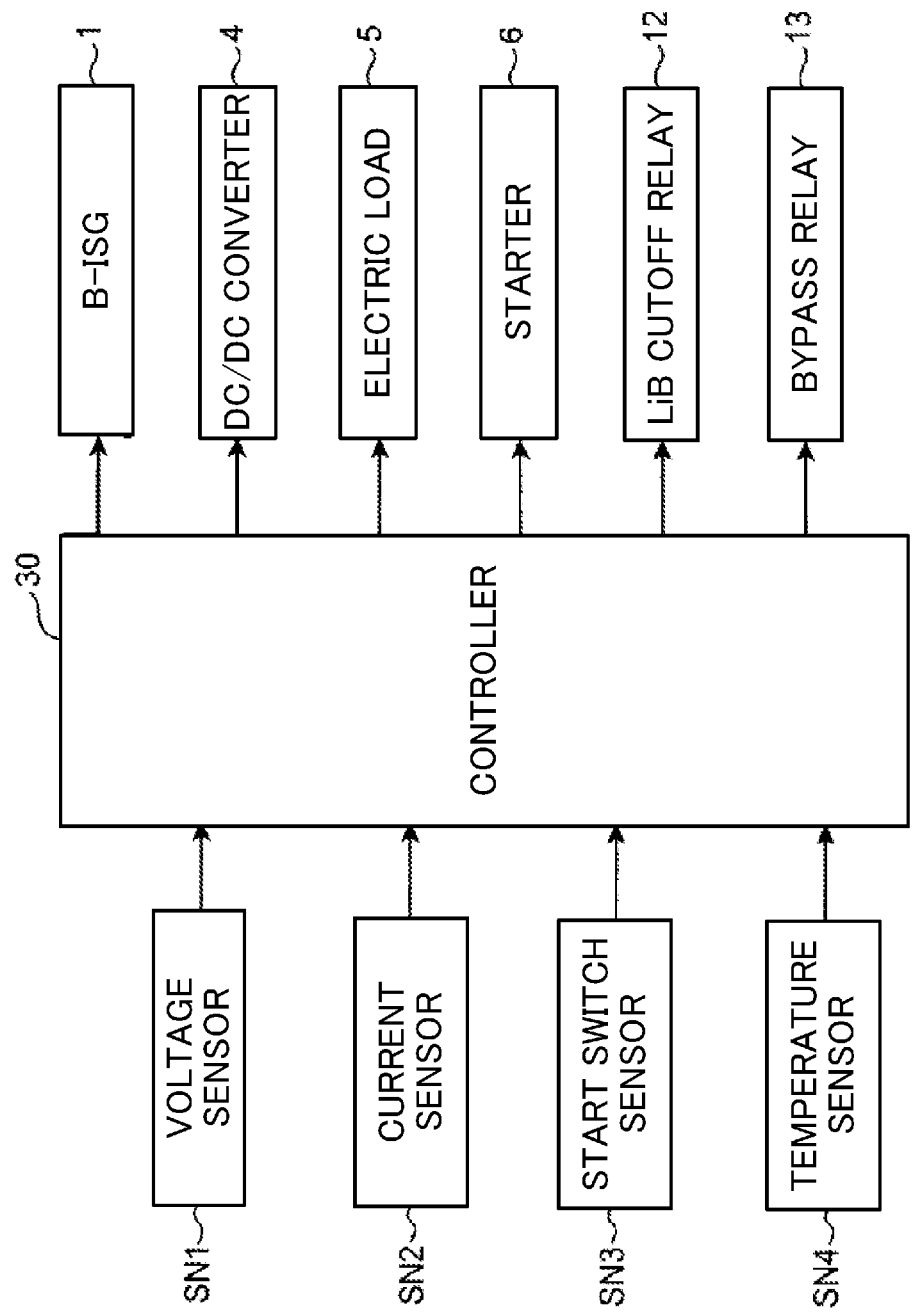
FIG. 2 is a block diagram showing the connection of a control system.

FIG. 2 is a block diagram showing the connection of the control system. As shown in FIG. 2, the components such as the B-ISG 1, the DC/DC converter 4, the starter 6, the LiB cutoff relay 12, the bypass relay 13, and the electric load 5 (the EPAS 21, the air-line conditioner 22, the audio 23, etc.) are connected with a controller 30 via various signal lines and controlled based on instructions from the controller 30. The controller 30 is a microcomputer made of conventionally well-known CPU, ROM, RAM, etc. and corresponds to a "control section" as defined in the claims.

The controller 30 is also connected with various sensors provided in the vehicle via signal lines. More specifically, the vehicle according to this embodiment is provided with a voltage sensor SN1, a current sensor SN2, a start switch sensor SN3, a temperature sensor SN4, etc., and configured so that information detected by these sensors is sequentially input into the controller 30.

The voltage sensor SN1 is a sensor that detects the voltage of the LiB 3 as also shown in FIG. 1.

The current sensor SN2 is a sensor that detects the current of the LiB 3 as also shown in FIG. 1.

The start switch sensor SN3 is a sensor that detects that an ignition key not shown, which is operated by the driver when the engine is started or stopped, has been operated to an engine startup position.

The temperature sensor SN4 is a sensor that detects the water temperature of a radiator not shown.

The controller 30 controls the amount of electric power generation by the B-ISG 1 and the operation of the B-ISG 1 as a starter, the voltage step-down operation by the DC/DC converter 4, the drive/stop of the electric load 5 and the starter 6, the ON/OFF operation of the relays 12 and 13, etc., based on the input information from the sensors SN1 to SN4, and estimates the residual capacity of the LiB 3.

(3) Estimation of Residual Capacity of Lithium Ion Battery

Figure 3:
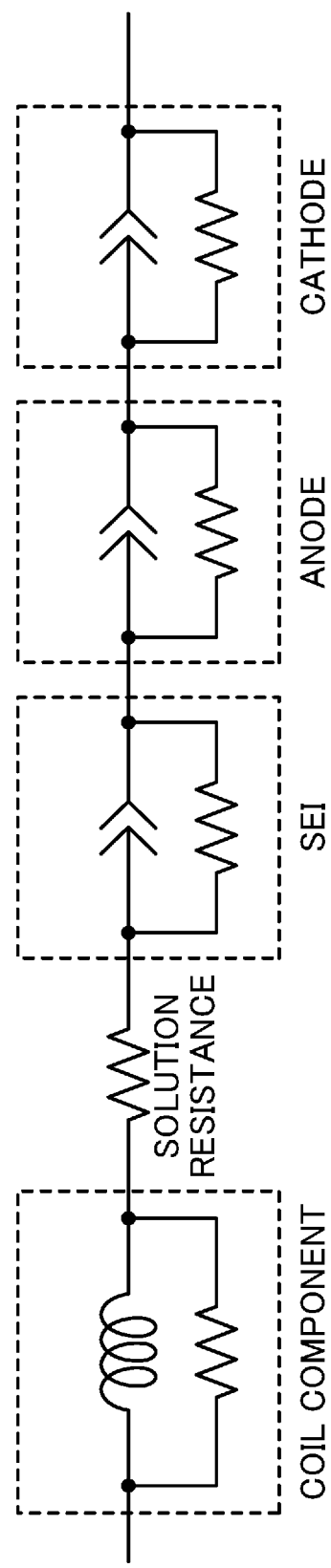
FIG. 3 is an equivalent circuit diagram of a lithium ion battery.

Next, an estimation method of the residual capacity of a lithium ion capacity in general will be described. FIG. 3 is an equivalent circuit diagram of a lithium ion battery. As illustrated, in the lithium ion battery, each of the cathode, the anode, the surface film (solid electrolyte interface (SEI)), etc. can be represented by a R-CPE (constant phase element) parallel circuit, and these R-CPE parallel circuits are connected in series.

Figure 4:
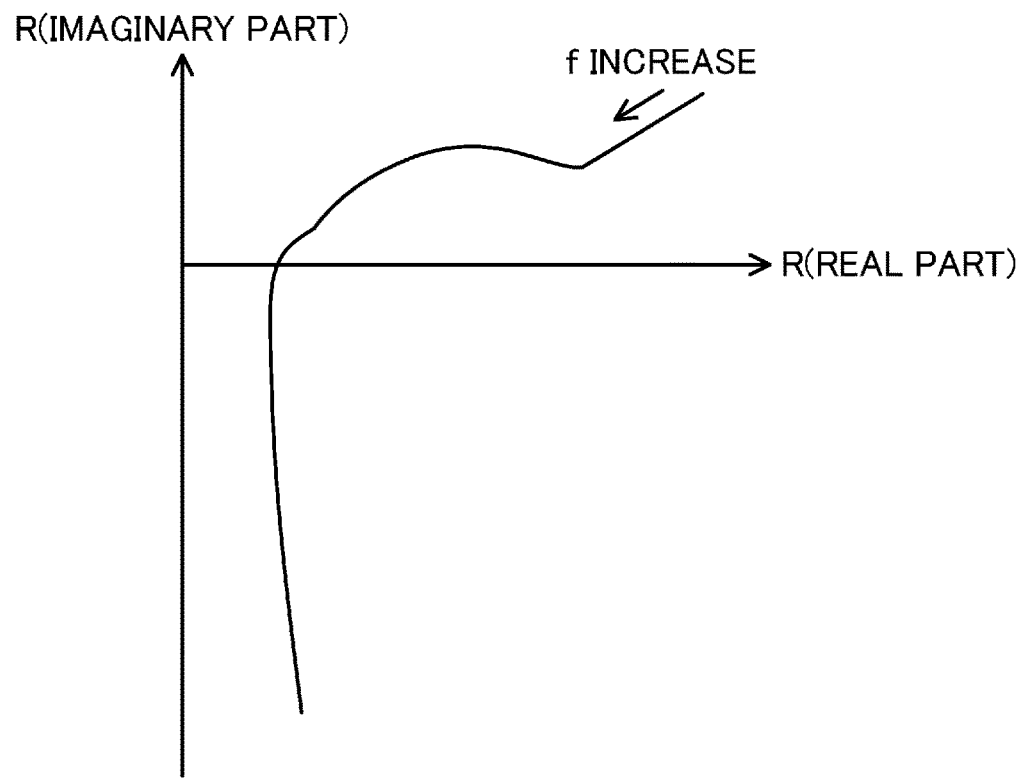
FIG. 4 is a Nyquist diagram showing AC impedance characteristics of a lithium ion battery.

The internal state of the lithium ion battery can be analyzed by an AC impedance method. FIG. 4 is a Nyquist diagram showing the AC impedance characteristics of the lithium ion battery. The AC impedance characteristics of FIG. 4 include AC impedance characteristics of the R-CPE parallel circuits of the cathode, the anode, and the SEI in the equivalent circuit of FIG. 3. Therefore, the AC impedance characteristics of FIG. 4 may be identified with the equivalent circuit of FIG. 3, and the results may be analyzed for the cathode and the anode separately, to obtain AC impedance characteristics of the cathode and the anode.

Figure 5:
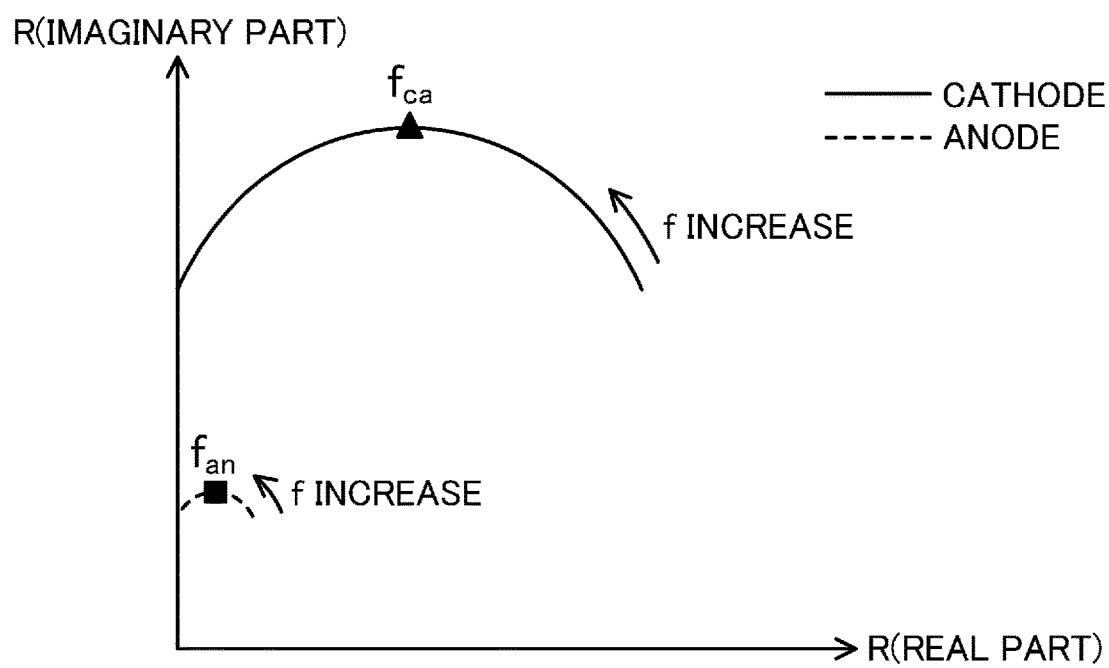
FIG. 5 is a Nyquist diagram showing AC impedance characteristics of a cathode and an anode.

FIG. 5 is a Nyquist diagram showing the AC impedance characteristics of the cathode and the anode. As shown in FIG. 5, the AC impedance characteristics are represented by a semicircular curve for each of the cathode and the anode. The cathode and the anode have inherent vertex frequencies $f_{ca}$ and $f_{an}$, respectively, which are constant even if the lithium ion battery degrades over time. It is therefore possible to calculate the cathode resistance from the voltage and current of the lithium ion battery at the time when time $T_1 = 1/f_{ca}$ has elapsed, and calculate the anode resistance from the voltage and current of the lithium ion battery at the time when time $T_2 = 1/f_{an}$ has elapsed, since the lithium ion battery has started supply of electric power to a load. Time $T_1$ corresponds to a "first time" as defined in the claims, and time $T_2$ corresponds to a "second time" as defined in the claims. Note that, while the wording that the resistance is measured will be sometimes used hereinafter, this means that the resistance is calculated from the voltage and the current.

Figure 6:
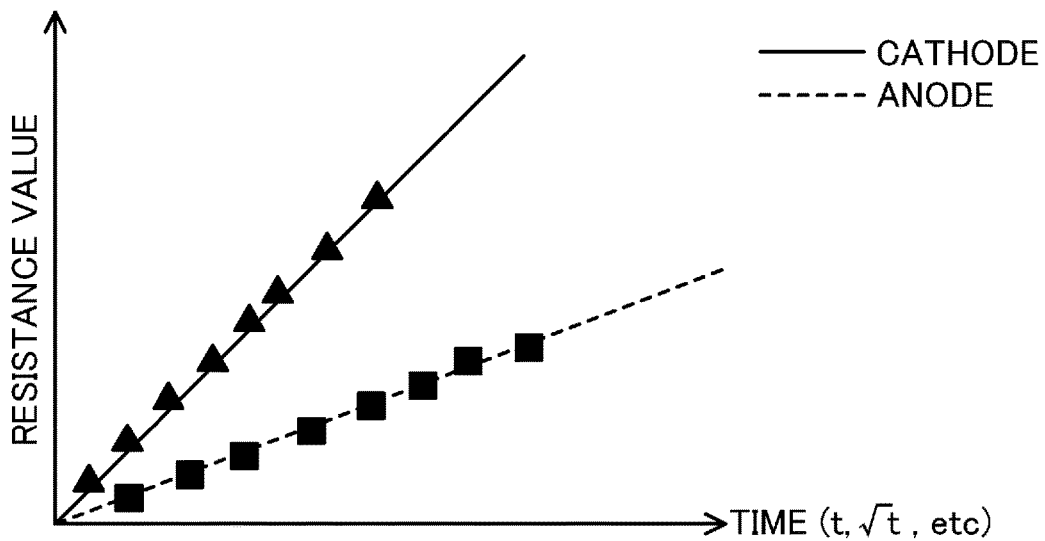
FIG. 6 is a graph showing increases over time in cathode resistance and anode resistance.

The cathode resistance and the anode resistance increase over time, and this causes capacity degradation of the lithium ion battery. The rates of increase over time in cathode resistance and anode resistance can be calculated from the values measured so far. FIG. 6 is a graph showing increases over time in cathode resistance and anode resistance. The graph of FIG. 6 was obtained using the initially-measured cathode resistance and anode resistance as the respective initial values (origins) and blotting subsequently-measured cathode resistances and anode resistances as relative values to the initial values. In this way, by performing multiple linear regression analysis for the cathode resistances and the anode resistances measured at a plurality of past time points, it is possible to calculate the rates of increase over time in cathode resistance and anode resistance. Note that it is also possible to calculate the rates of increase over time in cathode resistance and anode resistance from the previous measured values and the current measured values.

The residual capacity SOH of the lithium ion battery is expressed by $$SOH = \eta \times SOH^{(0)} \qquad (1)$$

where $SOH^{(0)}$ is the residual capacity of the lithium ion battery in its initial (new) state and $\eta$ is the capacity maintenance ratio. That is, the capacity degradation of the lithium ion battery can be grasped as a decrease in capacity maintenance ratio $\eta$. The capacity maintenance ratio $\eta$ can be estimated from the initial values of the capacity maintenance ratios of the cathode and the anode and the rates of increase over time in cathode resistance and anode resistance. The capacity maintenance ratios $\eta_{ca}$ and $\eta_{an}$ of the cathode and anode of the lithium ion battery are expressed by $$\eta_{ca} = f_{ca}(t) + \eta_{ca}^{(0)} \qquad (2)$$

$$\eta_{an} = f_{an}(t) + \eta_{an}^{(0)} \qquad (3)$$

where $\eta_{ca}^{(0)}$ and $\eta_{an}^{(0)}$ are the initial values of the capacity maintenance ratios of the cathode and the anode and $f_{ca}(t)$ and $f_{an}(t)$ are the functions that convert the rates of increase over time in cathode resistance and anode resistance into the rates of capacity decrease (functions having time t as an argument).

Figure 7:
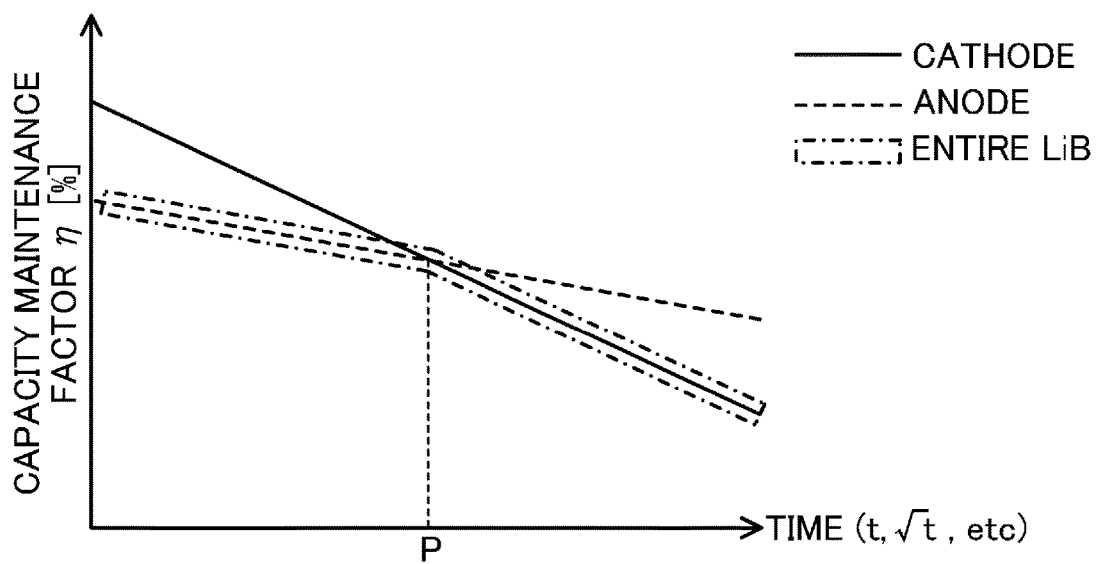
FIG. 7 is a graph showing degradation over time in cathode capacity and anode capacity.

FIG. 7 is a graph showing degradation over time in cathode capacity and anode capacity. Since it is considered that a lithium ion battery is generally manufactured to be cathode-rich or anode-rich, the initial values $\eta_{ca}^{(0)}$ and $\eta_{an}^{(0)}$ of the capacity maintenance ratios of the cathode and the anode are different from each other. Also, the capacity maintenance ratios of the cathode and anode of the lithium ion battery degrade over time independently from each other according to equations (2) and (3). Therefore, when two straight lines representing changes over time in the capacity maintenance ratios of the cathode and the anode are drawn, they may intersect with each other at time P when a predetermined time period has elapsed from the start of use of the lithium ion battery, as shown in FIG. 7.

The capacity maintenance ratio of the entire lithium ion battery is restricted to the lower one of the capacity maintenance ratios of the cathode and the anode. Therefore, in the example of FIG. 7, the capacity maintenance ratio η of the entire lithium ion battery in equation (1) is $\eta=\eta_{an}$ from the start of use until time P and $\eta=\eta_{ca}$ from time P onward. That is, in the example of FIG. 7, the degradation in anode capacity is predominant for the capacity degradation of the lithium ion battery from the start of use until time P, and then the degradation in cathode capacity becomes predominant from time P onward.

(4) Estimation of Residual Capacity of LiB 3 by Lithium Ion Battery Residual Capacity Estimation Device Next, the estimation of the residual capacity of the LiB 3 by a lithium ion battery residual capacity estimation device of this embodiment will be described in detail. The part constituted by the controller 30, the voltage sensor SN1, the current sensor SN2, and the temperature sensor SN4 corresponds to the lithium ion battery residual capacity estimation device of this embodiment.

In the lithium ion battery residual capacity estimation device of this embodiment, the controller 30 estimates the residual capacity of the LiB 3 according to the method described above. Moreover, if the controller 30 judges that the capacity degradation of the LiB 3 has proceeded beyond the catalog specification from the estimation of the residual capacity of the LiB 3, it can determine abnormality of the LiB 3. More specifically, for lithium ion battery products, characteristics data in which the residual capacity is associated with the open-circuit voltage have been published as catalog values. The controller 30 can determine abnormality of the LiB 3 if the residual capacity of the LiB 3 calculated according to the above-described method is lower than the residual capacity obtained from the characteristics data by a predetermined value or more or by a predetermined rate or more.

For the estimation of the residual capacity of the LiB 3 according to the above-described method, it is necessary to measure the cathode resistance and anode resistance of the LiB 3. For precise measurement of these resistances, it is preferable to detect the voltage and current of the LiB 3 at the timing when the LiB 3 outputs a large current. It is therefore preferable to detect the voltage and current of the LiB 3 at the timing when the B-ISG 1 is started with the LiB 3.

Further, it is necessary to detect the voltage and current of the LiB 3 at both time points when time $T_1$ (e.g., 0.1 seconds) has elapsed and when time $T_2$ (e.g., 0.5 seconds) has elapsed since the LiB 3 has started supply of electric power to the B-ISG 1. If the startup of the engine is fast, the supply of electric power from the LiB 3 to the B-ISG 1 may be terminated before the lapse of time $T_2$, causing a failure to detect the voltage and current of the LiB 3 at the time when time $T_2$ has elapsed during the startup of the B-ISG 1. As described above, the lithium ion battery residual capacity estimation device of this embodiment calculates the rates of increase over time in cathode resistance and anode resistance by performing multiple linear regression analysis for the cathode resistances and the anode resistances measured at a plurality of past time points. Therefore, if the situation of failing to detect the voltage and current of the LiB 3 at the time when time $T_2$ has elapsed continues for a predetermined time period or longer, there is a possibility that the estimation precision of the residual capacity of the LiB 3 may decrease. In consideration of this, when such a situation continues for a predetermined time period or longer, the controller 30 next time starts the B-ISG 1 with the LiB 3 under conditions under which the startup time of the B-ISG 1 will be longer, or drives a load other than the B-ISG 1, e.g., the electric load 5 with the LiB 3, to permit detection of the voltage and current of the LiB 3 at the time when time $T_2$ has elapsed. Control examples by the controller 30 will be described hereinafter.

First Control Example

Figure 8:
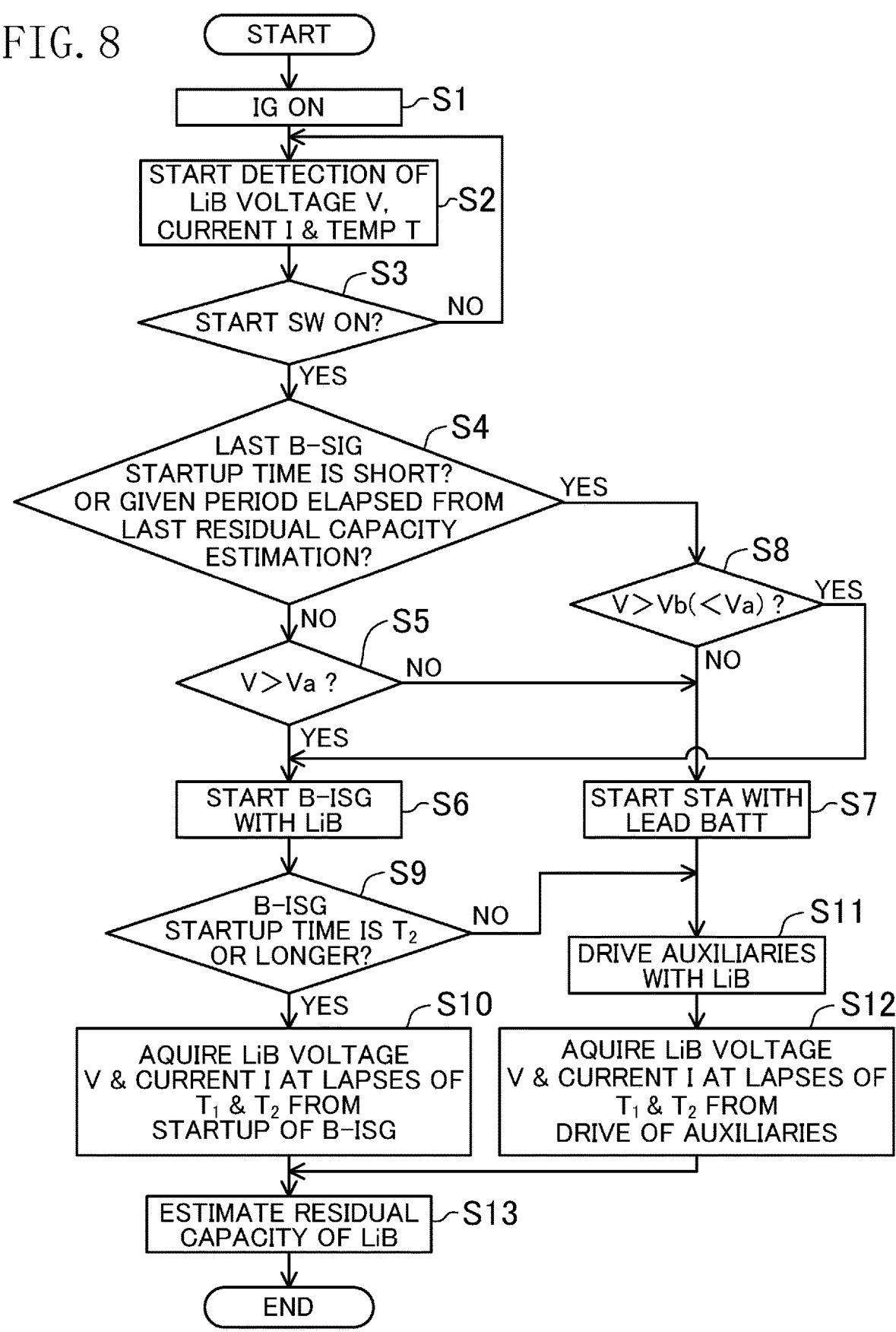
FIG. 8 is a flowchart showing a procedure of control (first control example) performed during startup of an engine.

FIG. 8 is a flowchart showing a procedure of control (first control example) performed by the controller 30 during startup of the engine.

When the ignition switch is turned ON in step S1, the voltage sensor SN1 and the current sensor SN2 start detection of the voltage V and current I of the LiB 3, and the temperature sensor SN4 starts detection of the temperature (water temperature of the radiator) T in step S2.

The controller 30 determines whether or not the start switch has been turned ON (that is, whether or not the driver has conducted the operation of starting the engine) based on input information from the start switch sensor SN3 in step S3. If the determination result is NO, the process returns to step S2, in which the voltage sensor SN1, the current sensor SN2, and the temperature sensor SN4 continue the detection of the voltage V, the current I, and the temperature T. If the determination result is YES, the process proceeds to step S4.

In step S4, the controller 30 determines whether or not the last startup time of the B-ISG 1 is shorter than time $T_2$, or whether or not a predetermined time period has elapsed from the last estimation of the residual capacity of the LiB 3. That the last startup time of the B-ISG 1 is shorter than time $T_2$ means that the estimation of the residual capacity of the LiB 3 during the last engine startup has failed, or that the estimation of the residual capacity of the LiB 3 has been performed from the voltage and current of the LiB 3 at the time when the electric load 5, which is smaller in current consumption than the B-ISG 1, has been driven with the LiB 3.

If the determination result is NO in step S4, the controller 30 compares the voltage V of the LiB 3 (the detected value of the voltage sensor SN1) with a criterion value Va in step S5. If V>Va (YES in step S5), the controller 30 starts the B-ISG 1 with the LiB 3 in step S6. The criterion value Va as the criterion for the startup of the B-ISG 1 with the LiB 3 is provided because, if the voltage of the LiB 3 is excessively low, it is unable to start the B-ISG 1 with the LiB 3. If V≤Va (NO in step S5), the controller 30, judging that it is unable to start the B-ISG 1 with the LiB 3, starts the starter 6 with the battery 2 in step S7.

If the determination result is YES in step S4, the controller 30 compares the voltage V of the LiB 3 (the detected value of the voltage sensor SN1) with another criterion value Vb in step S8. The criterion value Vb is set to be lower than the criterion value Va. If V>Vb (YES in step S8), the controller 30 starts the B-ISG 1 with the LiB 3 in step S6. That is, the criterion for the startup of the B-ISG 1 with the LiB 3 is relaxed, to permit use of the LiB 3 to start the B-ISG 1 even though the voltage V of the LiB 3 is low to a certain extent. If V≤Vb (NO in step S8), the controller 30, judging that it is unable to start the B-ISG 1 with the LiB 3 even if the relaxed criterion is applied, starts the starter 6 with the battery 2 in step S7.

When having started the B-ISG 1 with the LiB 3 in step S6, the controller 30 determines whether or not the startup time of the B-ISG 1 is $T_2$ or longer in step S9. If the startup time of the B-ISG 1 is $T_2$ or longer (YES in step S9), the controller 30 acquires, from the voltage sensor SN1 and the current sensor SN2, the detected values of the voltage V and current I of the LiB 3 at the time when time $T_1$ has elapsed, and the detected values of the voltage V and current I of the LiB 3 at the time when time $T_2$ has elapsed, since the LiB 3 has started supply of electric power to the B-ISG 1, in step S10.

On the other hand, when the starter 6 has been started with the battery 2 in step S7 because it is unable to start the B-ISG 1 with the LiB 3, or when the startup time of the B-ISG 1 is too short to satisfy $T_2$ in step S9 although the B-ISG 1 has been started with the LiB 3 (NO in step S9), the controller 30 supplies the electric power of the LiB 3 to the electric load 5 via the DC/DC converter 4, to drive the electric load 5 with the LiB 3 in step S11. Although the current of the LiB 3 for driving the electric load 5 is smaller than that for starting the B-ISG 1, it is possible to detect the voltage and current of the LiB 3 at the time when the LiB 3 supplies electric power to the load. Therefore, in step S12, the controller 30 acquires, from the voltage sensor SN1 and the current sensor SN2, the detected values of the voltage V and current I of the LiB 3 at the time when time $T_1$ has passed, and the detected values of the voltage V and current I of the LiB 3 at the time when time $T_2$ has passed, since the LiB 3 has started supply of electric power to the electric load 5.

In step S13, the controller 30 calculates the resistance values of the cathode and anode of the LiB 3 based on the voltage V and current I of the LiB 3 acquired in step S10 or step S12, and estimates the residual capacity of the LiB 3 from increases over time in the resistance values of the cathode and the anode. Once succeeding in estimating the residual capacity of the LiB 3, the controller 30 can determine abnormality of the LiB 3 and notify the driver of this determination.

Second Control Example

Figure 9:
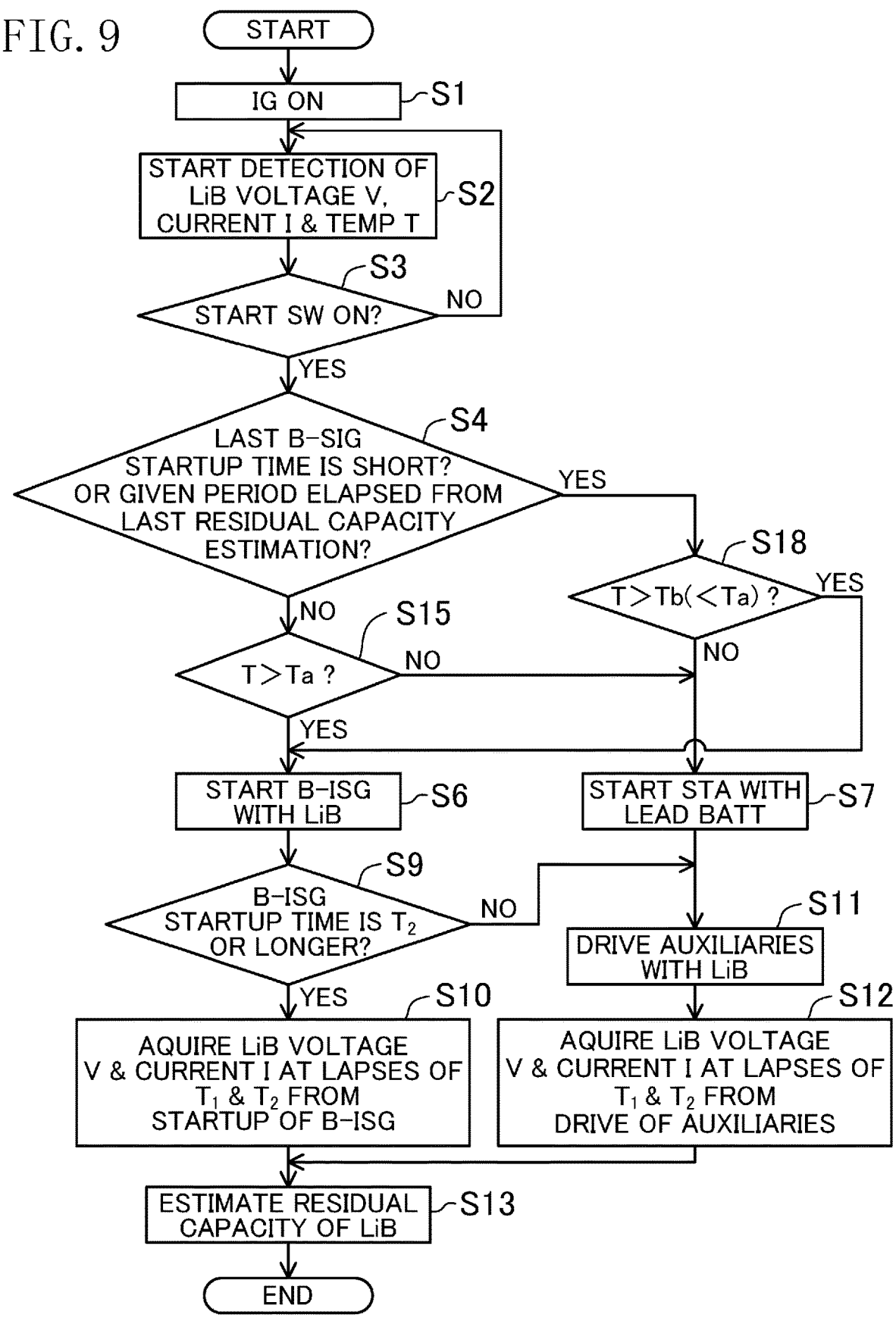
FIG. 9 is a flowchart showing a procedure of control (second control example) performed during startup of an engine.

FIG. 9 is a flowchart showing a procedure of control (second control example) performed by the controller 30 during startup of the engine. Note that description will be omitted for the same points as the first control example, and only points different from the first control example will be described hereinafter.

While which one, the B-ISG 1 or the starter 6, should be used to start the engine is decided based on the voltage of the LiB 3 in the first control example, it is decided based on the water temperature of the radiator in the second control example. That is, in the second control example, step S5 and step S8 in the first control example are replaced with step S15 and step S18.

The operations from step S1 through step S4 are the same as the first control example. If the determination result is NO in step S4, the controller 30 compares the water temperature T of the radiator (the detected value of the temperature sensor SN4) with a criterion value Ta in step S15. If T>Ta (YES in step S15), the controller 30 starts the B-ISG 1 with the LiB 3 in step S6. The criterion value Ta as the criterion for the startup of the B-ISG 1 with the LiB 3 is provided because, if the B-ISG 1 is started in the state where the engine temperature is excessively low, slipping of the belt of the B-ISG 1 may occur, which is unfavorable. If T≤Ta (NO in step S15), the controller 30 judges that it is unable to start the B-ISG 1 with the LiB 3, and starts the starter 6 with the battery 2 in step S7.

If the determination result is YES in step S4, the controller 30 compares the water temperature T of the radiator (the detected value of the temperature sensor SN4) with another criterion value Tb in step S18. The criterion value Tb is set to be lower than the criterion value Ta. If T>Tb (YES in step S18), the controller 30 starts the B-ISG 1 with the LiB 3 in step S6. That is, the criterion for the startup of the B-ISG 1 with the LiB 3 is relaxed, to permit use of the LiB 3 to start the B-ISG 1 even though the engine temperature is low to a certain extent. If T≤Tb (NO in step S18), the controller 30, judging that it is unable to start the B-ISG 1 with the LiB 3 even if the relaxed criterion is applied, starts the starter 6 with the battery 2 in step S7. Subsequent steps S9 through step S13 are the same as the first control example.

Third Control Example

Figure 10:
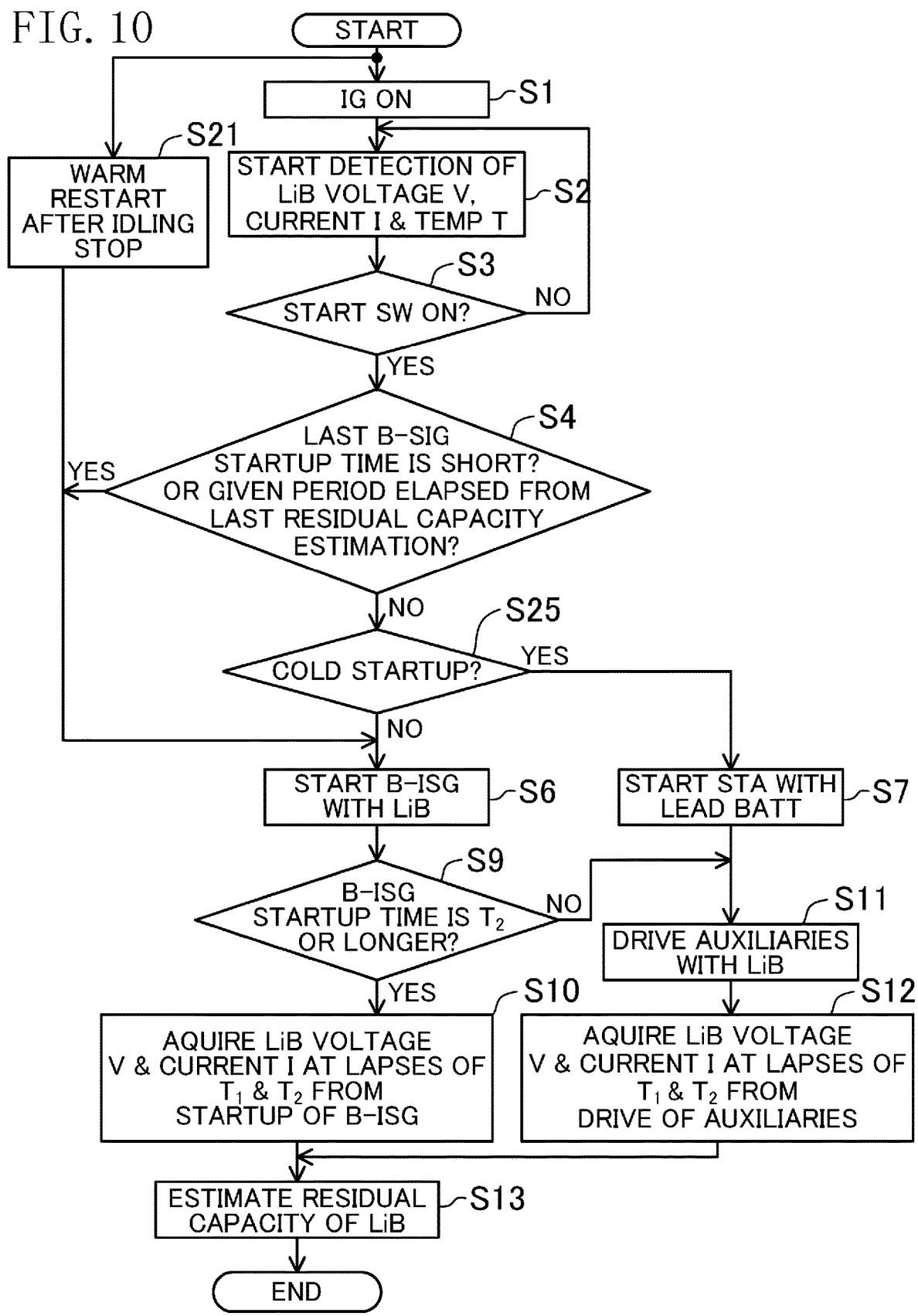
FIG. 10 is a flowchart showing a procedure of control (third control example) performed during startup of an engine.

FIG. 10 is a flowchart showing a procedure of control (third control example) performed by the controller 30 during startup of the engine. Note that description will be omitted for the same points as the first control example, and only points different from the first control example will be described hereinafter.

Some vehicles use the B-ISG 1 for warm restart after an idling stop of the engine. The third control example is a control example applicable to such vehicles that use the B-ISG 1 for warm restart after an idling stop. The third control example omits step S8 in the first control example, replaces step S5 with step S25, and newly provides step S21.

Steps S1 through S4 are the same as the first control example. Apart from the ON operation of the ignition in step S1, when warm restart after an idling stop is indicated in step S21, the controller 30 starts the B-ISG 1 with the LiB 3 in step S6.

If the determination result is NO in step S4, the controller 30 determines whether or not the engine is to be cold-started in step S25. If cold startup (YES in step S25), the controller 30 starts the starter 6 with the battery 2 to start the engine in step S7. If not cold startup (NO in step S25), the controller 30 starts the B-ISG 1 with the LiB 3 to start the engine in step S6.

If the determination result is YES in step S4, the controller 30 starts the B-ISG 1 with the LiB 3 to start the engine in step S6 without determining whether or not the engine is to be cold-started. That is, even if the engine is to be cold-started, the controller 30 does not start the starter 6 with the battery 2, but starts the ISG 1 with the LiB 3, to start the engine. Subsequent steps S9 through S13 are the same as the first control example.

Fourth Control Example

Figure 11:
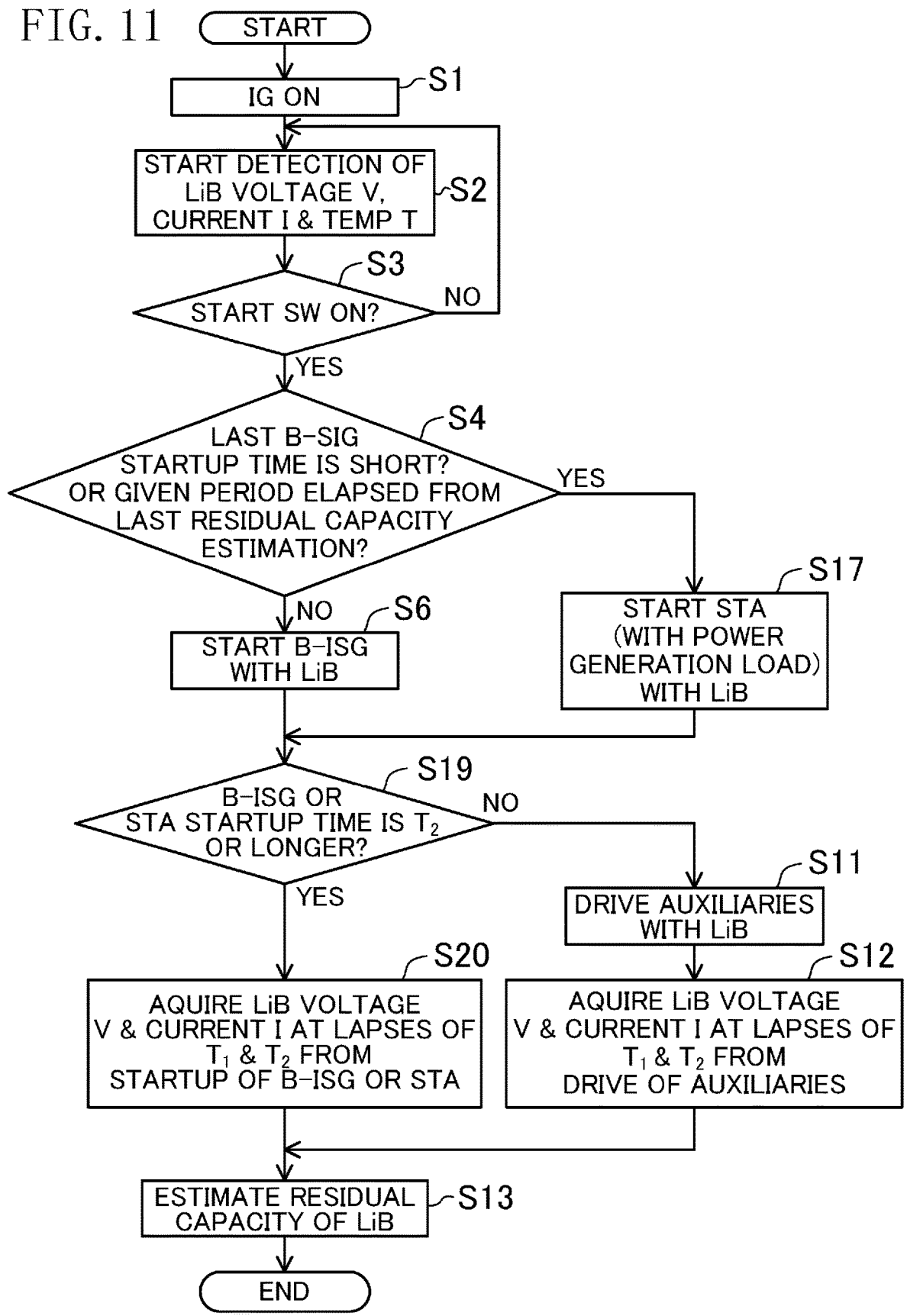
FIG. 11 is a flowchart showing a procedure of control (fourth control example) performed during startup of an engine.

FIG. 11 is a flowchart showing a procedure of control (fourth control example) performed by the controller 30 during startup of the engine. Note that description will be omitted for the same points as the first control example, and only points different from the first control example will be described hereinafter.

The LiB 3 is capable of, not only starting the B-ISG 1, but also starting the starter 6 by supplying electric power to the starter 6 via the DC/DC converter 4. In the fourth control example, therefore, even when startup of the B-ISG 1 with the LiB 3 fails, the starter 6 may be started with the LiB 3 to detect the voltage and current of the LiB 3 at this startup. The fourth control example omits step S5 and step S8 in the first control example, and replaces step S7, step S9, and step S10 with step S17, step S19, and step S20, respectively.

Steps S1 through S4 are the same as the first control example. If the determination result is NO in step S4, the controller 30 starts the B-ISG 1 with the LiB 3. If the determination result is YES in step S4, the controller 30 starts the starter 6 with the LiB 3 in step S17. At this time, a power generation load is acted on the starter 6 to permit supply of a large current from the LiB 3.

Once starting the B-ISG 1 with the LiB 3 in step S6, or starting the starter 6 with the LiB 3 in step S17, the controller 30 determines whether or not the startup time of the B-ISG 1 or the starter 6 is $T_2$ or longer in step S19. If the startup time of the B-ISG 1 or the starter 6 is $T_2$ or longer (YES in S19), the controller 30 acquires, from the voltage sensor SN1 and the current sensor SN2, the detected values of the voltage V and current I of the LiB 3 at the time when time $T_1$ has elapsed, and the detected values of the voltage V and current I of the LiB 3 at the time when time $T_2$ has elapsed, since the LiB 3 has started supply of electric power to the B-ISG 1 or the starter 6, in step S20.

If the startup time of the B-ISG 1 or the starter 6 is short of $T_2$ in step S19 (NO in step S19), the controller 30 supplies the electric power of the LiB 3 to the electric load 5 via the DC/DC converter 4, to drive the electric load 5 with the LiB 3 in step S11. Subsequent steps S11 through S13 are the same as the first control example.

Fifth Control Example

Figure 12:
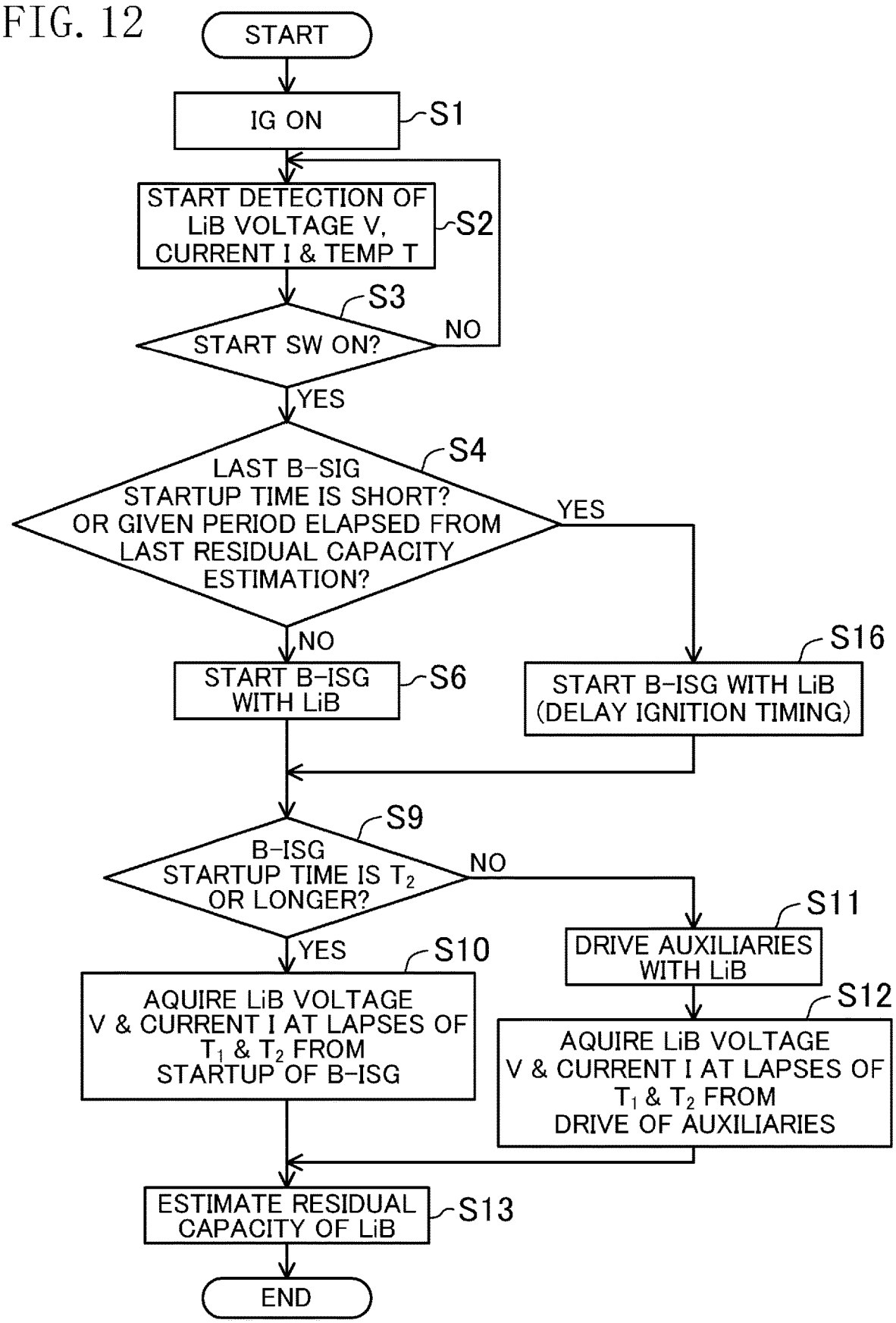
FIG. 12 is a flowchart showing a procedure of control (fifth control example) performed during startup of an engine.

FIG. 12 is a flowchart showing a procedure of control (fifth control example) performed by the controller 30 during startup of the engine. Note that description will be omitted for the same points as the first control example, and only points different from the first control example will be described hereinafter.

As described above, it is preferable to estimate the residual capacity of the LiB 3 from the voltage and current of the LiB 3 at the time when the LiB 3 is being used to start the B-ISG 1. In the fifth control example, therefore, control is made to forcibly extend the startup time of the B-ISG 1. The fifth control example omits step S5, step S7, and step S8 in the first control example, and provides step S16.

Steps S1 through S4 are the same as the first control example. If the determination result is NO in step S4, the controller 30 starts the B-ISG 1 with the LiB 3 in step S6. If it is YES in step S4, the controller 30 starts the B-ISG 1 with the LiB 3 delaying the ignition timing of the engine in step S16. Subsequent steps S9 through S13 are the same as the first control example.

(5) Function

As described above, in this embodiment, the lithium ion battery residual capacity estimation device that estimates the residual capacity of the LiB 3 that starts the B-ISG 1 includes: the voltage sensor SN1 that detects the voltage of the LiB 3; the current sensor SN2 that detects the current of the LiB 3; and the controller 30 that calculates resistance values of the cathode and anode of the LiB 3 based on the detected values of the voltage sensor SN1 and the current sensor SN2 at the time when time $T_1$ has elapsed, and the detected values of the voltage sensor SN1 and the current sensor SN2 at the time when time $T_2$, longer than time $T_1$, has elapsed, from the startup of the B-ISG 1, and estimates the residual capacity of the LiB 3 from increases over time in the resistance values of the cathode and the anode. The controller 30 starts the B-ISG 1 with the LiB 3 under conditions under which the startup time of the B-ISG 1 will be longer when the last startup time of the B-ISG 1 is shorter than time $T_2$ or when a predetermined time period has elapsed from the last estimation of the residual capacity.

Having the configuration described above, since the startup time of the B-ISG 1 is extended when the last startup time of the B-ISG 1 is shorter than time $T_2$ or when a predetermined time period has elapsed from the last estimation of the residual capacity, it is possible to detect the voltage and current of the LiB 3 at the time when time $T_2$ has elapsed from the startup of the B-ISG 1. This makes it possible to precisely estimate the residual capacity of the LiB 3.

(6) Alteration

While the case of applying the technology disclosed herein to a gasoline engine-mounted vehicle has been described as an example in the above embodiment, the technology disclosed herein is also naturally applicable to vehicles having engines other than the gasoline engine (e.g., a diesel engine).

INDUSTRIAL APPLICABILITY

As described above, the technology disclosed herein is useful as a lithium ion battery residual capacity estimation device.

DESCRIPTION OF REFERENCE CHARACTERS

1 B-ISG (engine starter)
3 LiB (lithium ion battery)
5 Electric load (auxiliaries)
6 Starter (another starter)
SN1 Voltage sensor
SN2 Current sensor
SN4 Temperature sensor
Controller (control section)

The invention claimed is:

1. A lithium ion battery residual capacity estimation device that estimates a residual capacity of a lithium ion battery that starts an engine starter, comprising:
   a voltage sensor that detects a voltage of the lithium ion battery;
   a current sensor that detects a current of the lithium ion battery; and
   a control section that calculates resistance values of a cathode and anode of the lithium ion battery based on detected values of the voltage sensor and the current sensor at the time when a first time has elapsed, and detected values of the voltage sensor and the current sensor at the time when a second time, longer than the first time, has elapsed, from startup of the engine starter, and estimates the residual capacity of the lithium ion battery from increases over time in the resistance values of the cathode and the anode,
   wherein
   the control section starts the engine starter with the lithium ion battery under conditions under which the startup time of the engine starter is longer when the last startup time of the engine starter is shorter than the second time or when a predetermined time period has elapsed from the last estimation of the residual capacity.

2. The lithium ion battery residual capacity estimation device of claim 1, wherein the control section starts the engine starter with the lithium ion battery even when the detected value of the voltage sensor is lower than a criterion value for starting the engine starter, to increase the startup time of the engine starter.

3. The lithium ion battery residual capacity estimation device of claim 1, further comprising a temperature sensor that detects a water temperature of a radiator, wherein the control section starts the engine starter with the lithium ion battery even when a detected value of the temperature sensor is lower than a criterion value for starting the engine starter, to increase the startup time of the engine starter.

4. The lithium ion battery residual capacity estimation device of claim 1, wherein the control section starts the engine starter with the lithium ion battery during warm restart after an idling stop of the engine, and further starts the engine starter with the lithium ion battery even during cold startup, to increase the startup time of the engine starter.

5. The lithium ion battery residual capacity estimation device of claim 1, wherein the control section starts another starter different from the engine starter with the lithium ion battery by acting a power generation load on the another starter when the last startup time of the engine starter is shorter than the second time and a predetermined time period has elapsed from the last estimation of the residual capacity, and estimates the residual capacity of the lithium ion battery from the voltage value and current value of the lithium ion battery at this time.

6. The lithium ion battery residual capacity estimation device of claim 1, wherein the control section drives auxiliaries with the lithium ion battery when failing to start the engine starter with the lithium ion battery, and estimates the residual capacity of the lithium ion battery from the voltage value and current value of the lithium ion battery at this time.

7. The lithium ion battery residual capacity estimation device of claim 1, wherein the control section delays ignition timing of the engine to increase the startup time of the engine starter.

* * * * *